United States Patent
Yun et al.

(10) Patent No.: US 11,075,348 B2
(45) Date of Patent: Jul. 27, 2021

(54) THIN FILM TRANSISTOR AND THIN FILM TRANSISTOR ARRAY AND ELECTRONIC DEVICE

(71) Applicants: Samsung Electronics Co., Ltd., Suwon-si (KR); THE BOARD OF TRUSTEES OF THE LELAND STANFORD JUNIOR UNIVERSITY, Stanford, CA (US)

(72) Inventors: Youngjun Yun, Yongin-si (KR); Xuzhou Yan, Stanford, CA (US); Jinyoung Oh, Stanford, CA (US); Zhenan Bao, Stanford, CA (US); Hung-Chin Wu, Stanford, CA (US)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 37 days.

(21) Appl. No.: 16/534,253

(22) Filed: Aug. 7, 2019

(65) Prior Publication Data
US 2021/0043860 A1 Feb. 11, 2021

(51) Int. Cl.
*H01B 1/12* (2006.01)
*H01L 51/00* (2006.01)
(Continued)

(52) U.S. Cl.
CPC ........ *H01L 51/0566* (2013.01); *C08G 61/126* (2013.01); *C08G 73/00* (2013.01);
(Continued)

(58) Field of Classification Search
CPC . H01B 1/00; H01B 1/12; H01B 1/121; H01B 1/122; H01B 1/124; H01B 1/127;
(Continued)

(56) References Cited

U.S. PATENT DOCUMENTS 8,440,258 B2  5/2013 Reiss et al.
9,401,487 B2*  7/2016 Im ..................... H01L 51/0566
(Continued)

FOREIGN PATENT DOCUMENTS

EP  2829561 A1  1/2015
JP  5100830 B2  12/2012
(Continued)

OTHER PUBLICATIONS

Binghua Zhou et al., "A flexible, self-healing and highly stretchable polymer electrolyte via quadruple hydrogen bonding for lithium-ion batteries", Journal of Materials Chemistry A, DOI: 10.1039/c8ta01907j, (2018).
(Continued)

*Primary Examiner* — Mark Kopec
(74) *Attorney, Agent, or Firm* — Harness, Dickey & Pierce, P.L.C.

(57) ABSTRACT

Disclosed are a thin film transistor includes a gate electrode, an active layer including a semiconductor material and a first elastomer, a gate insulator between the gate electrode and the active layer, and a source electrode and a drain electrode electrically connected to the active layer, wherein each of the semiconductor material and the first elastomer has a hydrogen bondable moiety, and the semiconductor material and the first elastomer are subjected to a dynamic intermolecular bonding by a hydrogen bond and a thin film transistor array and an electronic device including the same.

22 Claims, 13 Drawing Sheets

(51) Int. Cl.
| | | |
|---|---|---|
| H01L 51/05 | (2006.01) | |
| H01L 51/10 | (2006.01) | |
| C08G 61/12 | (2006.01) | |
| C08G 73/00 | (2006.01) | |
| H01L 27/28 | (2006.01) | |

(52) U.S. Cl.
CPC ........... *H01B 1/124* (2013.01); *H01L 27/283* (2013.01); *H01L 51/004* (2013.01); *H01L 51/0036* (2013.01); *H01L 51/0043* (2013.01); *H01L 51/0097* (2013.01); *H01L 51/052* (2013.01); *H01L 51/055* (2013.01); *H01L 51/0545* (2013.01); *H01L 51/105* (2013.01); *C08G 2261/124* (2013.01); *C08G 2261/1412* (2013.01); *C08G 2261/1646* (2013.01); *C08G 2261/18* (2013.01); *C08G 2261/3221* (2013.01); *C08G 2261/3223* (2013.01); *C08G 2261/3241* (2013.01); *C08G 2261/334* (2013.01); *C08G 2261/514* (2013.01); *C08G 2261/92* (2013.01)

(58) Field of Classification Search
CPC . H01B 1/128; H01L 51/0566; H01L 51/0036; H01L 51/004; H01L 51/0043; C08G 2261/18; C08G 2261/19; C08G 2261/30; C08G 2261/31; C08G 2261/32
See application file for complete search history.

(56) References Cited

U.S. PATENT DOCUMENTS

| | | | | |
|---|---|---|---|---|
| 10,050,203 | B2* | 8/2018 | Chung | .................. C08G 61/126 |
| 10,418,559 | B2 | 9/2019 | Suzuki et al. | |
| 2016/0032054 | A1 | 2/2016 | Cheng et al. | |
| 2016/0049217 | A1* | 2/2016 | Tee | ........................ H01M 4/622 |
| | | | | 429/217 |
| 2016/0280548 | A1 | 9/2016 | Bao et al. | |
| 2017/0098791 | A1* | 4/2017 | Bao | ........................ H01L 51/052 |
| 2017/0174842 | A1 | 6/2017 | Wang et al. | |
| 2017/0331045 | A1 | 11/2017 | Chung et al. | |
| 2017/0331057 | A1* | 11/2017 | Chung | .................. C08G 77/38 |
| 2017/0346013 | A1 | 11/2017 | Chung et al. | |
| 2018/0094106 | A1 | 4/2018 | Ma et al. | |
| 2018/0323376 | A1 | 11/2018 | Chung et al. | |
| 2020/0002501 | A1* | 1/2020 | Yun | ........................ C08G 18/61 |

FOREIGN PATENT DOCUMENTS

| | | |
|---|---|---|
| KR | 10-1417996 B1 | 7/2014 |
| KR | 10-2015-0023661 A | 3/2015 |
| KR | 10-1630173 B1 | 6/2016 |
| KR | 10-2017-0134169 A | 12/2017 |

OTHER PUBLICATIONS

Chiyoung Park et al., "Recent Developments in Stimuli-Responsive Polymers Based on Dynamic Bonds", Polymer Science and Technology, vol. 24, No. 4, pp. 338-346 (2013)—Translations.

Igor Pochorovski et al., "H-Bonded Supramolecular Polymer for the Selective Dispersion and Subsequent Release of Large-Diameter Semiconducting Single-Walled Carbon Nanotubes", Journal of the American Chemical Society, vol. 137, No. 13, p. 4328-4331, (2015).

Jens Hentschel et al., "Self-Healing Supramolecular Block Copolymers", Angewandte Chemie International Edition, vol. 51, No. 42, p. 10561-10565, DOI: 10.1002/anie.201204840, (2012).

Kyung-In Jang et al., "Self-assembled three dimensional network designs for soft electronics", Nature Communications, 8:15894, DOI: 10.1038/ncomms15894, (2017).

Kuniharu Takei et al., "Nanowire active-matrix circuitry for low-voltage macroscale artificial skin", Nature Materials Letters, vol. 9, p. 821-826, DOI: 10.1038/NMAT2835, (Oct. 2010).

Jonathan Viventi, "Flexible, foldable, actively multiplexed, high-density electrode array for mapping brain activity in vivo", Nature Neuroscience Technical Reports, vol. 14, No. 12, p. 1599-1605 (Dec. 2011).

Jin Young Oh et al., "Intrinsically stretchable and healable semiconducting polymer for organic transistors", Nature Letter, vol. 539, p. 11-415, DOI: 10.1038/nature20102, (Nov. 17, 2016).

Ging-Ji Nathan Wang et al., "Inducing Elasticity through Oligo-Siloxane Crosslinks for Intrinsically Stretchable Semiconducting Polymers", Advanced Functional Materials, vol. 26, No. 40, p. 7254-7262, DOI: 10.1002/adfm.201602603, (2016).

Rudy J. Wojtecki et al., "Using the dynamic bond to access macroscopically responsive structurally dynamic polymers", Nature Materials, vol. 10, p. 14-27, DOI: 10.1038/NMAT2891, (Jan. 2011).

Chao Wang et al., "Thiol-ene Cross-Linked Polymer Gate Dielectrics for Low-Voltage Organic Thin-Film Transistors", Chemistry of Materials, vol. 25, p. 4806-4812, DOI: 10.1021/cm403203k, (2013).

Aleem Gangjee et al., "Design, Synthesis, and X-ray Crystal Structure of a Potent Dual Inhibitor of Thymidylate Synthase and Dihydrofolate Reductase as an Antitumor Agent", J. Med. Chem., vol. 43, No. 3837, DOI: 10.1021/jm0002001, (Sep. 13, 2000).

Qiuhong Zhang et al., "Synthesis of N-Phenylaminomethyl POSS and Its Utilization in Polyurethane", Macromolecules Article, vol. 44, p. 550-557, DOI: 10.1021/ma101825j, (Jan. 10, 2011).

* cited by examiner

THIN FILM TRANSISTOR AND THIN FILM TRANSISTOR ARRAY AND ELECTRONIC DEVICE

BACKGROUND

(a) Field

A thin film transistor, a thin film transistor array, and an electronic device are disclosed.

(b) Description of the Related Art

Development of flexible and stretchable electronic materials and electronic devices has led to research on smart skin devices, soft robots, and biomedical devices similar to human skin. Such a device requires a thin film transistor capable of controlling cross-talk between signals.

SUMMARY

An embodiment provides a thin film transistor that is effectively applicable to flexible and stretchable electronic devices.

Another embodiment provides a thin film transistor array including the thin film transistor.

Another embodiment provides an electronic device including the thin film transistor array.

According to an embodiment, a thin film transistor includes a gate electrode, an active layer including a semiconductor material and a first elastomer, a gate insulator between the gate electrode and the active layer, and a source electrode and a drain electrode electrically connected to the active layer, wherein each of the semiconductor material and the first elastomer has a hydrogen bondable moiety, and the semiconductor material and the first elastomer are subjected to a dynamic intermolecular bonding by a hydrogen bond.

The hydrogen bondable moiety may be a multiple hydrogen bondable moiety.

The hydrogen bondable moiety may include a moiety represented by Chemical Formula A.

[Chemical Formula A]

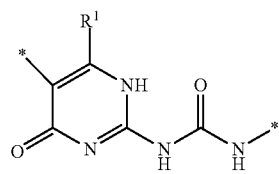

In Chemical Formula A,
$R^1$ is hydrogen, a substituted or unsubstituted C1 to C30 alkyl group, or a substituted or unsubstituted C6 to C30 aryl group.

The hydrogen bondable moiety may be represented by Chemical Formula AA.

[Chemical Formula AA]

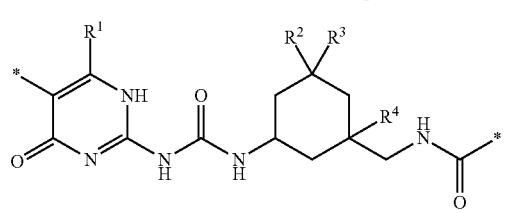

In Chemical Formula AA,
$R^1$ to $R^4$ are independently hydrogen, a substituted or unsubstituted C1 to C30 alkyl group or a substituted or unsubstituted C6 to C30 aryl group.

The semiconductor material may be a semiconductor polymer including a semiconducting moiety and the hydrogen bondable moiety and the first elastomer may be an elastic polymer including an elastic moiety and the hydrogen bondable moiety.

The semiconducting moiety may include a heterocycle including N, O, S, Se, Te, or combination thereof.

The semiconductor polymer may include at least one structural unit including the semiconducting moiety and the hydrogen bondable moiety and the semiconducting moiety may include at least one of moieties represented by one of Chemical Formulae 1-1 to 1-10.

[Chemical Formula 1-1]

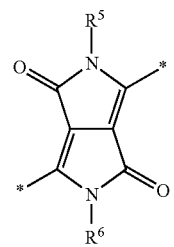

In Chemical Formula 1-1,
$R^5$ and $R^6$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-2]

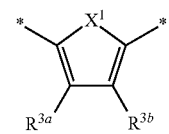

wherein, in Chemical Formula 1-2,
$X^1$ is O, S, Se, or $NR^a$, and
$R^a$, $R^{3a}$, and $R^{3b}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-3]

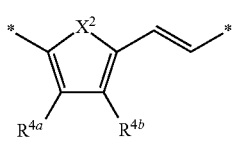

wherein, in Chemical Formula 1-3, $X^2$ is O, S, Se, or $NR^a$, and $R^a$, $R^{4a}$, and $R^{4b}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-4]

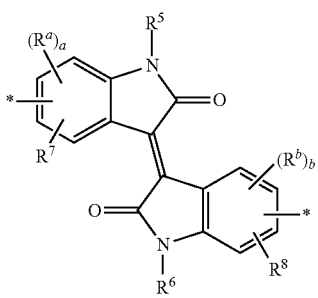

wherein, in Chemical Formula 1-4, $R^5$, $R^6$, $R^7$, and $R^8$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, $R^a$ and $R^b$ are a C1 to C6 alkyl group, and a and b are independently an integer ranging from 0 to 2,

[Chemical Formula 1-5]

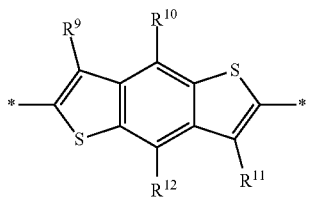

wherein, in Chemical Formula 1-5, $R^9$, $R^{10}$, $R^{11}$, and $R^{12}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-6]

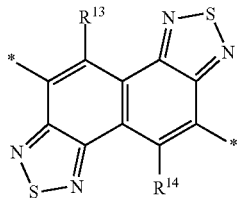

wherein, in Chemical Formula 1-6, $R^{13}$ and $R^{14}$ are independently hydrogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof,

[Chemical Formula 1-7]

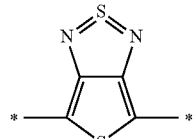

wherein, in Chemical Formula 1-7, $R^{15}$ is a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof,

[Chemical Formula 1-8]

[Chemical Formula 1-9]

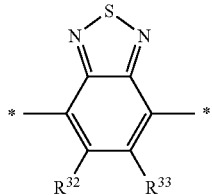

wherein, in Chemical Formula 1-9, $R^{32}$ and $R^{33}$ are independently hydrogen, a halogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

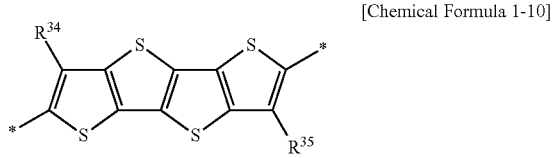

[Chemical Formula 1-10]

wherein, in Chemical Formula 1-10,
$R^{34}$ and $R^{35}$ are independently hydrogen, a halogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C30 aryl group, or a combination thereof, and
* is a linking point with an adjacent moiety.

The semiconductor polymer may include a structural unit represented by Chemical Formula 3.

The first elastomer may include a structural unit having a polyorganosiloxane moiety and a moiety represented by Chemical Formula AA.

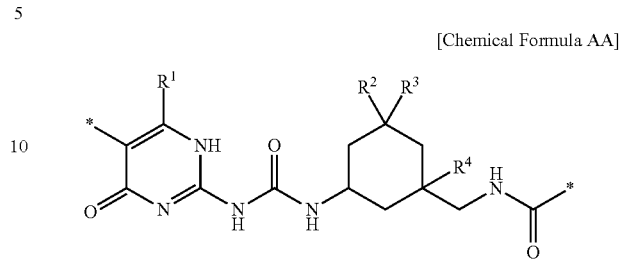

[Chemical Formula AA]

In Chemical Formula AA,
$R^1$ to $R^4$ are independently hydrogen, a substituted or unsubstituted C1 to C30 alkyl group, or a substituted or unsubstituted C6 to C30 aryl group.

The active layer may include a matrix comprising the first elastomer and a plurality of fiber-like domains comprising

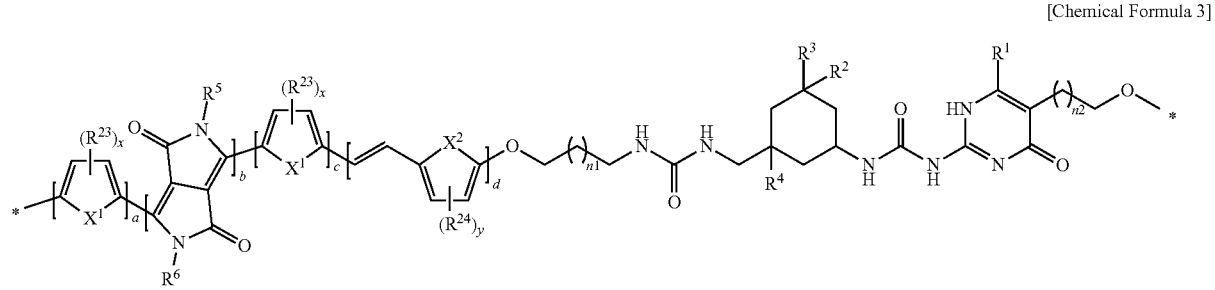

[Chemical Formula 3]

In Chemical Formula 3,
$R^1$ to $R^4$ are independently hydrogen, a substituted or unsubstituted C1 to C30 alkyl group, or a substituted or unsubstituted C6 to C30 aryl group,
$R^5$ and $R^6$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,
$R^{23}$ and $R^{24}$ are independently hydrogen, a halogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof,
x and y are an integer ranging from 0 to 2,
a, c, and d are independently 0 to 10,
b is 1 to 10,
n1 and n2 are independently 0 to 30, and
* is a linking point with an adjacent moiety.

The elastic moiety may include a polyorganosiloxane moiety, a polyamide moiety, a polyisobutene moiety, a polyolefin moiety, a polyester moiety, a polyurethane moiety, or a combination thereof.

the semiconductor material, the plurality of fiber-like domains being distributed in the matrix.

The active layer may include the semiconductor material and the first elastomer in a weight ratio of about 9:1 to about 1:9.

The gate insulator may include a second elastomer having a multiple hydrogen bondable moiety.

The second elastomer may be an elastic polymer including an elastic moiety and the multiple hydrogen bondable moiety.

The elastic moiety may include a polyorganosiloxane moiety, a polyamide moiety, a polyisobutene moiety, a polyolefin moiety, a polyester moiety, a polyurethane moiety, or a combination thereof.

The multiple hydrogen bondable moiety may include the moiety represented by Chemical Formula A.

The multiple hydrogen bondable moiety may be represented by the Chemical Formula AA.

The gate insulator may have a thickness of about 1 μm to about 3 μm.

At least one of the gate electrode, the source electrode, and the drain electrode may include a flexible conductor.

According to another embodiment, a thin film transistor array in which a plurality of thin film transistors is arranged in a matrix format.

According to another embodiment, an electronic device including an array of the thin film transistors is provided.

The electronic device may be a wearable device or a skin-type device.

Thin film transistor and the electronic device may have stretchability and self-healable characteristics.

DETAILED DESCRIPTION OF EMBODIMENTS

Example embodiments will hereinafter be described in detail, and may be easily performed by a person skilled in the related art. However, this disclosure may be embodied in many different forms and is not to be construed as limited to the exemplary embodiments set forth herein.

When a definition is not otherwise provided, "substituted" may refer to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 haloalkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, a C3 to C30 heteroaryl group, and a combination thereof.

As used herein, when a definition is not otherwise provided, "hetero" may refer to inclusion of at least one, for example 1 to 3 heteroatoms selected from N, O, S, Si, and P.

"Heterocycle" may refer to a heterocycloalkyl group and a heteroaryl group.

"Combination thereof" may refer to a mixture, a stack structure, a composite, a copolymer, an alloy, a blend, a reaction product of components.

Hereinafter, a thin film transistor according to an embodiment is described.

Figure 1:
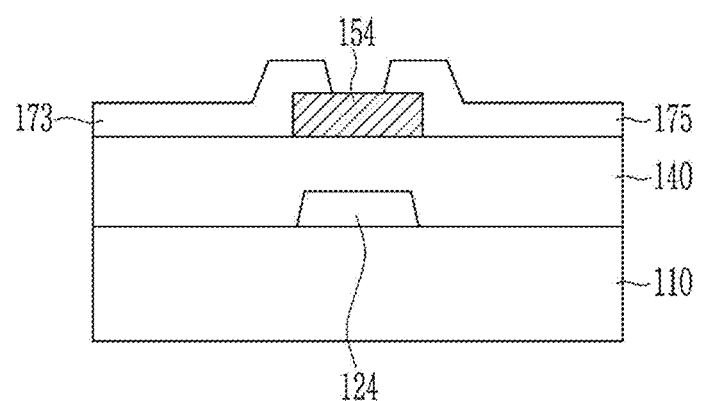
FIG. 1 is a schematic view showing a thin film transistor according to an embodiment.

FIG. 1 is a schematic view showing a thin film transistor according to an embodiment.

Referring to FIG. 1, a thin film transistor according to an embodiment includes a gate electrode 124; an active layer 154; a gate insulator 140 between the gate electrode 124 and the active layer 154; and/or a source electrode 173 and a drain electrode 175 electrically connected to the active layer 154.

The substrate 110 may be a glass substrate, a silicon wafer, or a polymer substrate, for example a silicon wafer or a polymer substrate.

A gate electrode 124 is formed on the substrate 110. The gate electrode 124 is connected to a gate line transferring a gate signal. The gate electrode 124 may be made of a metal such as gold (Au), copper (Cu), nickel (Ni), aluminum (Al), molybdenum (Mo), chromium (Cr), tantalum (Ta), titanium (Ti), or an alloy thereof; a conductive oxide such as zinc oxide, indium oxide, tin oxide, indium tin oxide (ITO), indium zinc oxide (IZO), or fluorine doped tin oxide; a carbon structure such as carbon nanotube (CNT), or a combination thereof, but is not limited thereto. For example, the gate electrode 124 may include a flexible conductor.

In FIG. 1, the gate electrode 124 is formed on the substrate 110, but the present disclosure is not limited thereto, and may be embedded in the substrate 110. For example, the substrate 110 may be a silicon wafer and a high-concentration doped region in substrate 110 may be a gate electrode 124.

The active layer 154 includes a semiconductor material and a first elastomer.

Each of the semiconductor material and the first elastomer may independently be a monomer, an oligomer, or a polymer having hydrogen bondable moiety and the semiconductor material and the first elastomer may be subjected to a dynamic intermolecular bonding by a hydrogen bond. Herein, the dynamic intermolecular bonding refers to a bond between the semiconductor material and the first elastomer that may be easily broken by stimulus and spontaneously self-healed and rebonded. The dynamic intermolecular bonding may be for example a dynamic intermolecular crosslinking.

The hydrogen bondable moiety included in the semiconductor material and the hydrogen bondable moiety in the first elastomer may be the same or different.

For example, the hydrogen bondable moiety may be a multiple hydrogen bondable moiety, for example a double hydrogen bondable moiety, a triple hydrogen bondable moiety, or quadruple hydrogen bondable moiety.

For example, the hydrogen bondable moiety may independently include a moiety represented by Chemical Formula A, but is not limited thereto.

[Chemical Formula A]

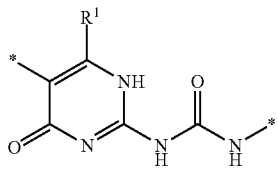

In Chemical Formula A,

R$^1$ is hydrogen, a substituted or unsubstituted C1 to C30 alkyl group, or a substituted or unsubstituted C6 to C30 aryl group.

For example, the hydrogen bondable moiety may be represented by Chemical Formula AA, but is not limited thereto.

[Chemical Formula AA]

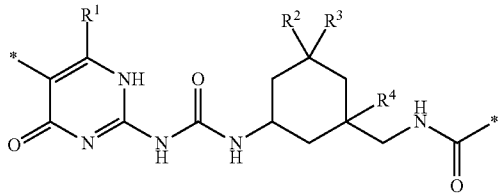

In Chemical Formula AA,

R$^1$ to R$^4$ are independently hydrogen, a substituted or unsubstituted C1 to C30 alkyl group, or a substituted or unsubstituted C6 to C30 aryl group.

For example, the semiconductor material and the first elastomer may be a monomer, an oligomer, or a polymer having the hydrogen bondable moiety represented by Chemical Formula AA in common.

For example, the semiconductor material may be a semiconductor polymer. The semiconductor polymer may be a linear polymer including at least one structural unit and each structural unit may include a semiconducting moiety and a hydrogen bondable moiety.

The semiconducting moiety may have a conjugation structure and may include for example a heterocycle including N, O, S, Se, Te, or a combination thereof. Examples of the conjugation structure may include for example furan, thiophene, selenophene, telulophene, a derivative thereof, fused rings thereof, or a combination thereof, but are not limited.

For example, the semiconducting moiety may include at least one moiety represented by one of Chemical Formulae 1-1 to 1-10, but is not limited thereto.

[Chemical Formula 1-1]

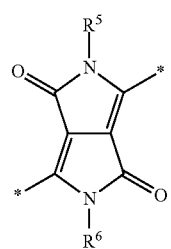

In Chemical Formula 1-1,

R$^5$ and R$^6$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of R$^5$ and R$^6$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof,

* may be a linking point with an adjacent moiety,

[Chemical Formula 1-2]

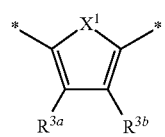

wherein, in Chemical Formula 1-2,

X$^1$ may be O, S, Se, Te, or NR$^a$,

R$^a$, R$^{3a}$, and R$^{3b}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of R$^a$, R$^{3a}$, and R$^{3b}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a linking point with an adjacent moiety,

[Chemical Formula 1-3]

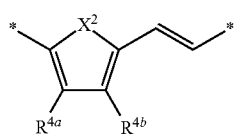

wherein, in Chemical Formula 1-3,

X$^2$ may be O, S, Se, Te, or NR$^a$,

R$^a$, R$^{4a}$, and R$^{4b}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of R$^a$, R$^{4a}$, and R$^{4b}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and \* may be a linking point with an adjacent moiety,

[Chemical Formula 1-4]

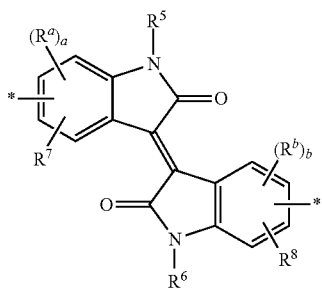

wherein, in Chemical Formula 1-4, $R^5$, $R^6$, $R^7$, and $R^8$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^5$, $R^6$, $R^7$, and $R^8$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, $R^a$ and $R^b$ may be a C1 to C6 alkyl group, a and b may independently be an integer ranging from 0 to 2, and \* may be a linking point with an adjacent moiety,

[Chemical Formula 1-5]

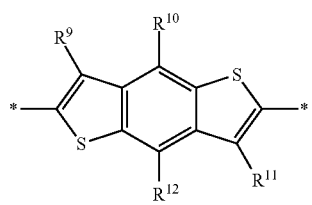

wherein, in Chemical Formula 1-5, $R^9$, $R^{10}$, $R^{11}$, and $R^{12}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^9$, $R^{10}$, $R^{11}$, and $R^{12}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and \* may be a linking point with an adjacent moiety,

[Chemical Formula 1-6]

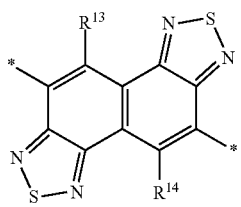

wherein, in Chemical Formula 1-6, $R^{13}$ and $R^{14}$ may independently be hydrogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof, for example at least one of $R^{13}$ and $R^{14}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and \* may be a linking point with an adjacent moiety,

[Chemical Formula 1-7]

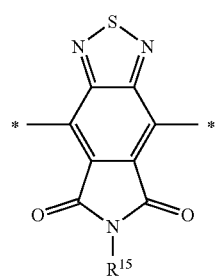

wherein, in Chemical Formula 1-7, $R^{15}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and \* may be a linking point with an adjacent moiety,

[Chemical Formula 1-8]

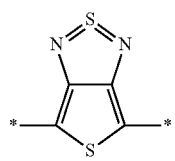

-continued

[Chemical Formula 1-9]

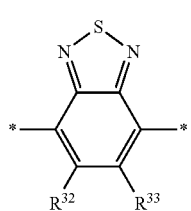

wherein, in Chemical Formula 1-9,
$R^{32}$ and $R^{33}$ may independently be hydrogen, a halogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and

* may be a linking point with an adjacent moiety,

[Chemical Formula 1-10]

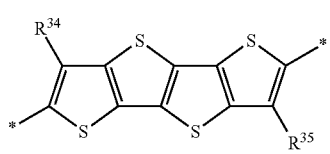

wherein, in Chemical Formula 1-10,
$R^{34}$ and $R^{35}$ may independently be hydrogen, a halogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C30 aryl group, or a combination thereof, and

* may be a linking point with an adjacent moiety.

For example, the semiconducting moiety may be represented by Chemical Formula 2, but is not limited thereto.

[Chemical Formula 2]

In Chemical Formula 2,
$R^5$ and $R^6$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^5$ and $R^6$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, $X^1$ and $X^2$ may be the same or different and may independently be O, S, Se, or $NR^a$ (wherein $R^a$ is hydrogen or a C1 to C6 alkyl group), $R^{23}$ and $R^{24}$ may be the same or different and may independently be hydrogen, a halogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof, x and y may be an integer ranging from 0 to 2,
a, c, and d may independently be 0 to 10,
b may be 1 to 10, and
* may be a linking point with an adjacent moiety.

The hydrogen bondable moiety may be boned with the semiconducting moiety.

For example, the semiconductor polymer may include the semiconducting moiety including at least one moiety represented by one of Chemical Formulae 1-1 to 1-10 and the hydrogen bondable moiety represented by Chemical Formula A.

For example, the semiconductor polymer may include a structural unit represented by Chemical Formula 3, but is not limited thereto.

[Chemical Formula 3]

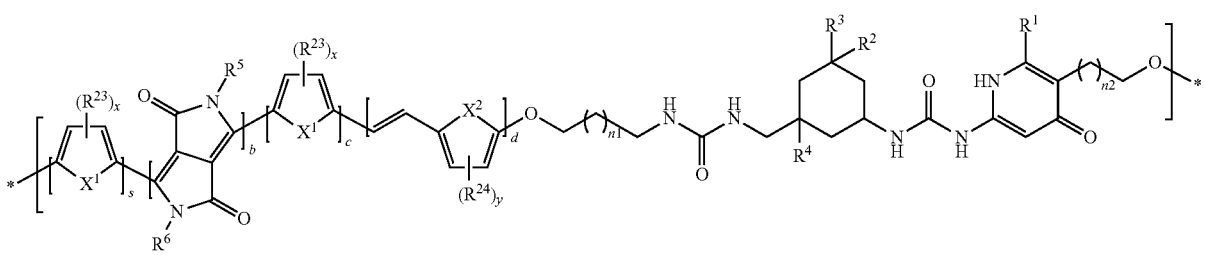

In Chemical Formula 3, $R^1$ to $R^6$, $R^{23}$, $R^{24}$, x, y, and a to d may be the same as described above, and n1 and n2 may independently be 0 to 30.

The first elastomer may be an elastic polymer. The elastic polymer may be a linear polymer including at least one structural unit and each structural unit may include an elastic moiety and a hydrogen bondable moiety.

The elastic moiety may include a polyorganosiloxane moiety, a polyamide moiety, a polyisobutene moiety, a polyolefin moiety, a polyester moiety, a polyurethane moiety, or a combination thereof, but is not limited thereto. For example, the elastic moiety may be a polyorganosiloxane moiety, for example a polyalkylsiloxane moiety, for example a polydimethylsiloxane (PDMS) moiety.

For example, the elastic polymer may include a structural unit having a polyorganosiloxane moiety and the moiety represented by Chemical Formula A and may include for example a structural unit having a polydimethylsiloxane moiety and the moiety represented by Chemical Formula A.

For example, the elastic polymer may include a structural unit represented by Chemical Formula 4, but is not limited thereto.

The active layer 154 having such stretchability and self-healable properties may be obtained by a combination of a semiconductor material and a first elastomer and for example the active layer 154 may include the semiconductor material and the first elastomer in a weight ratio of about 9:1 to about 1:9. The active layer 154 may include the semiconductor material and the first elastomer in a weight ratio of about 8:2 to about 2:8, about 7:3 to about 3:7, about 4:6 to about 6:4, or about 5:5. When the semiconductor material and the first elastomer are included within the ranges, stretchability and self-healable properties may be more effectively exhibited without affecting the electrical characteristics of the active layer 154.

The gate insulator 140 may include a second elastomer that is the same as or different from the first elastomer.

The second elastomer may be a monomer, an oligomer, or a polymer having a hydrogen bondable moiety. For example, the hydrogen bondable moiety may be a multiple hydrogen bondable moiety, for example a double hydrogen bondable moiety, a triple hydrogen bondable moiety, or quadruple hydrogen bondable moiety. For example, the hydrogen bondable moiety may independently include the aforementioned moiety represented by Chemical Formula A, for example the aforementioned moiety represented by Chemical Formula AA, but is not limited thereto.

[Chemical Formula 4]

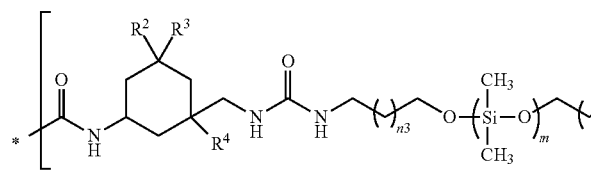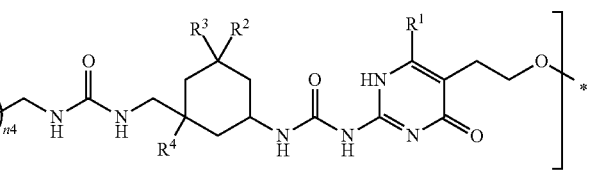

In Chemical Formula 4, $R^1$ to $R^4$ may independently be hydrogen, a substituted or unsubstituted C1 to C30 alkyl group, or a substituted or unsubstituted C6 to C30 aryl group, m may be 1 to 100, and n3 and n4 may independently be 0 to 30.

The semiconductor material and the first elastomer may be mixed in the active layer 154.

Figure 2:
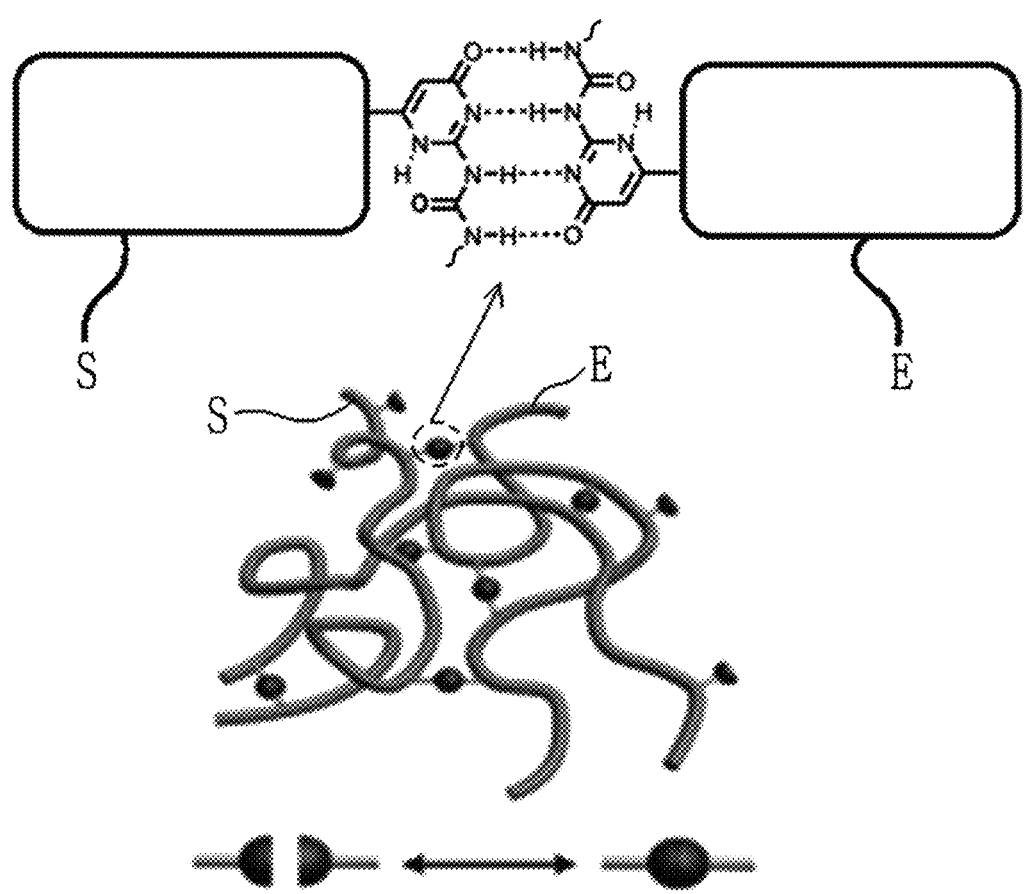
FIG. 2 is a schematic view showing dynamic intermolecular bonding between a semiconductor material and a first elastomer in an active layer of a thin film transistor according to an embodiment.

FIG. 2 is a schematic view showing dynamic intermolecular bonding between a semiconductor material and a first elastomer in an active layer 154 of a thin film transistor according to an embodiment.

Referring to FIG. 2, a hydrogen bondable moiety of the semiconductor material (S) and a hydrogen bondable moiety of the first elastomer (E) may be subjected to a dynamic intermolecular bonding through a hydrogen bond, and accordingly, the bond between the semiconductor material and the first elastomer may be easily broken by a stimulus or self-healed and rebonded.

For example, the active layer 154 may include a matrix formed of the first elastomer and a plurality of domains formed of the semiconductor material, wherein the plurality of domains may be uniformly or nonuniformly dispersed in the matrix. The domains may be crystal structures formed through a phase-separation, for example, fiber-like phase separation domains. According to stretching of the active layer 154, the plurality of domains may be differently dispersed in the matrix.

The semiconductor material and the first elastomer are subjected to dynamic intermolecular bonding by a hydrogen bond and thus it may not only impart improved stretchability to the active layer 154, but also automatically self-healable characteristics when the active layer 154 is damaged, thereby self-healing the damaged portion quickly at room temperature.

For example, the second elastomer may be an elastic polymer. The elastic polymer may be a linear polymer including at least one structural unit and each structural unit may include an elastic moiety and a hydrogen bondable moiety.

The elastic moiety may include a polyorganosiloxane moiety, a polyamide moiety, a polyisobutene moiety, a polyolefin moiety, a polyester moiety, a polyurethane moiety, or a combination thereof, but is not limited thereto. For example, the elastic moiety may be a polyorganosiloxane moiety, for example a polyalkylsiloxane moiety, for example a polydimethylsiloxane (PDMS) moiety.

For example, the second elastomer may include a structural unit including a polyorganosiloxane moiety and the moiety represented by Chemical Formula AA, for example a structural unit including a polydimethylsiloxane moiety and the moiety represented by Chemical Formula AA.

The gate insulator 140 may have a thickness of about 1 μm to about 3 μm.

The gate insulator 140 includes the second elastomer and thus it may not only impart improved stretchability to the gate insulator 140, but also automatically self-healable characteristics when the gate insulator 140 is damaged, thereby self-healing the damaged portion quickly at room temperature.

In addition, the active layer 154 and the gate insulator 140 have stretchability and self-healable characteristics simultaneously, and thereby it may be effectively applied to various electronic devices requiring stretchability and self-healable characteristics.

The source electrode 173 and the drain electrode 175 face each other in the center of the active layer 154. The source electrode 173 is connected to a data line for transmitting a data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. For example, the source electrode 173 and the drain electrode 175 may include a flexible conductor.

Although the bottom gate structured thin film transistor is exemplified as a thin film transistor, it is not limited thereto, and it may be applied to all thin film transistors such as a top gate structured thin film transistor.

A unit device including the aforementioned thin film transistor may be arranged in a matrix format of a plurality of rows and columns to form a thin film transistor array.

The thin film transistor array may be applied to various electronic devices.

The electronic device may include for example a substrate; a plurality of wires arranged in row and column directions on a substrate; thin film transistor array; and a driver, and each wire may be connected to the aforementioned thin film transistor. The electronic device may further include an encapsulation film covering the thin film transistor array. The encapsulation film may include an insulating material and may be made of for example an organic material, an inorganic material, and/or an organic/inorganic material. The encapsulation film may prevent or reduce penetration of moisture and contaminants, so that when the electronic device including the thin film transistor array is attached to the skin, it may prevent or reduce absorption of sweat and the like and prevent or reduce deterioration of the device.

The electronic device may be for example a flexible and stretchable electronic device, a wearable device, and/or a skin-like device.

Hereinafter, the embodiments are illustrated in more detail with reference to examples. However, these are examples, and the present scope is not limited thereto.

SYNTHESIS EXAMPLES

Synthesis Example 1: Synthesis of Semiconductor Polymer (1) Materials and Methods All reagents are commercially available and used as supplied without further purification. A DPP core is synthesized according to a method described in S3. Polymerization reactions are performed in a CEM Discover microwave reactor. $^1$H NMR and $^{13}$C NMR spectra are recorded on Varian Mercury spectrometer ($^1$H 400 MHz, $^{13}$C 100 MHz) at 293 K and referenced against the residual solvent peak. Polymer NMR spectra are reported in deuterated 1,1,2,2-tetrachloroethane (TCE-d4) at 413K and referenced against the residual solvent peak at 6 ppm. Number average molecular weight (Mn) and weight average molecular weight (Mw) are determined on a Tosoh High-temperature EcoSEC system equipped with a TSKgel GPC column (GMH$_{HR}$-H; 300 mm×7.8 mm) at 180° C. using 1,2,4-trichlorobenzene as an eluent. The system is calibrated against narrow weight average dispersity (Đ<1.10) polystyrene standards. UV-vis spectra in solution and thin film are acquired with an Agilent Cary 6000i UV/Vis/NIR spectrometer. Cyclic voltammetry and differential pulse voltammetry (step size: 2 mV, step time: 50 ms, a pulse amplitude: 100 mV) are performed using a CH instrument potentiostat with a standard three-electrode setup. ITO treated glass is used as working electrode, an Ag/Ag+ reference electrode calibrated against Fc/Fc+ and a platinum rod as a counter electrode. The measurements are carried out at room temperature in anhydrous and deoxygenated acetonitrile with 0.1 M tetrabutyl ammonium hexafluorophosphate as a supporting electrolyte at a scan rate of 50 mV/s. DSC experiments are carried out with a TA Instruments DSC Q2000 using Tzero Aluminum pans and TGA plots are obtained with a Mettler Toledo AG-TGA/SDTA851e.

S3: Matthews, J. R.; Niu, W.; Tandia, A.; Wallace, A. L.; Hu, J.; Lee, W.-Y.; Giri, G.; Mannsfeld, S. C. B.; Xie, Y.; Cai, S.; Fong, H. H.; Bao, Z.; He, M. Chem. Mater. 2013, 25, 782-789.

[Reaction Scheme 1]

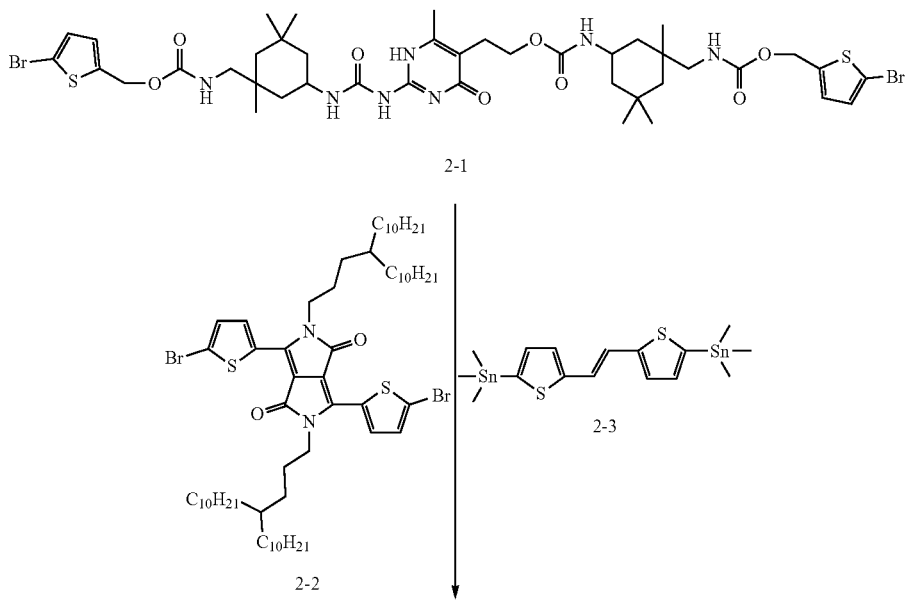

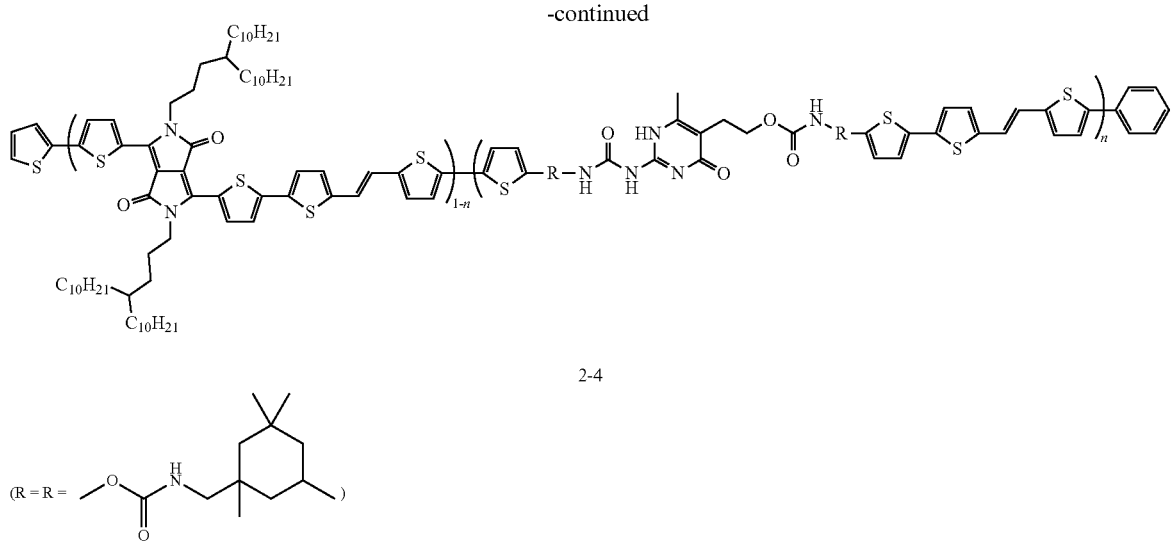

2-4

(2) Synthesis of Semiconducting Polymer

Compounds 2-1 and 2-2 (0.11 mmol in total, a feeding ratio 0:1 (P1), 0.05:0.95 (P2), 0.10:0.90 (P3), and 0.15:0.85 (P4)) and Compound 2-3 (0.11 mmol) are introduced into a microwave vial. Subsequently, 2 mol % of recrystallized tris(dibenzylideneacetone) dipalladium (0) and 8 mol % of tri-o-tolylphosphine are added thereto. All reactants are dissolved in 3.5 ml of anhydrous chlorobenzene, and the resulting solution degassed during 30 minutes. The microwave vial is sealed and submitted to the following temperature profile, 2 minutes at 100° C., 2 minutes at 120° C., 5 minutes at 140° C., 5 minutes at 160° C., and 40 minutes at 180° C., in a microwave reactor. After the reaction is cooled down, 10 mol % of trimethyl(phenyl)stannane are added thereto, and the crude polymer solution obtained therefrom is heated again to 1 minute 100° C., 1 minute at 120° C., 2 minutes at 140° C., and 3 minutes at 160° C. To complete the end-capping of the polymer, 10 mol % of bromobenzene are added thereto and the reaction vessel submitted one last time to microwave heating (1 minute at 100° C., 1 minute at 120° C., 2 minutes at 140° C., and 3 minutes at 160° C.). In order to ensure the solubility of the polymer and to effectively solubilize the crude polymer before purification, the solution is diluted by addition of 3 ml of 1,1,2,2-tetrachloroethane and warmed in the microwave to 140° C. during 10 minutes. (E)-N,N-diethyl-2-phenyldiazene-1-carbothioamide is added thereto to chelate residual palladium, and the solution is vigorously stirred at 80° C. in an oil bath during 2 hours. Afterwards the crude polymer solution is precipitated into well-stirred methanol, and the resulting dark blue polymer fibres filtered into a glass fibre Soxhlet thimble. The polymer is extracted with methanol, acetone, and hexane respectively for 24 hours before the polymer is extracted from the thimble with chloroform. The polymeric chloroform solution is concentrated on the rotary evaporator and precipitated into methanol. The purified polymer fibres are filtered off and recovered to dry for 24 hours under high vacuum to obtain a semiconductor polymer (Compound 2-4 (P1, P2, P3, and P4)).

A number average molecular weight ($M_n$) and a weight average molecular weight (Mw) of the obtained semiconductor polymer are shown in Table 1.

TABLE 1

| Compounds 2 to 4 | Mn (kDa) | Mw/Mn |
|---|---|---|
| P1 | 20.0 | 2.31 |
| P2 | 22.6 | 2.50 |
| P3 | 19.4 | 2.76 |
| P4 | 20.1 | 2.44 |

Figure 3:
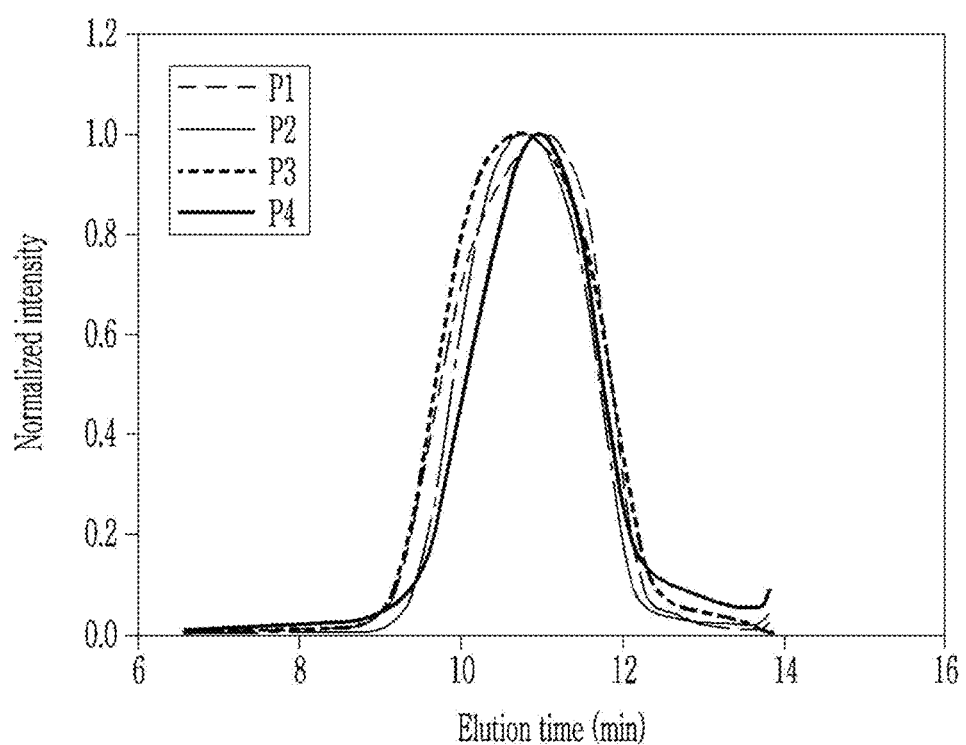
FIG. 3 is a GPC graph of the semiconductor polymer obtained from Synthesis Example 1.
Figure 4:
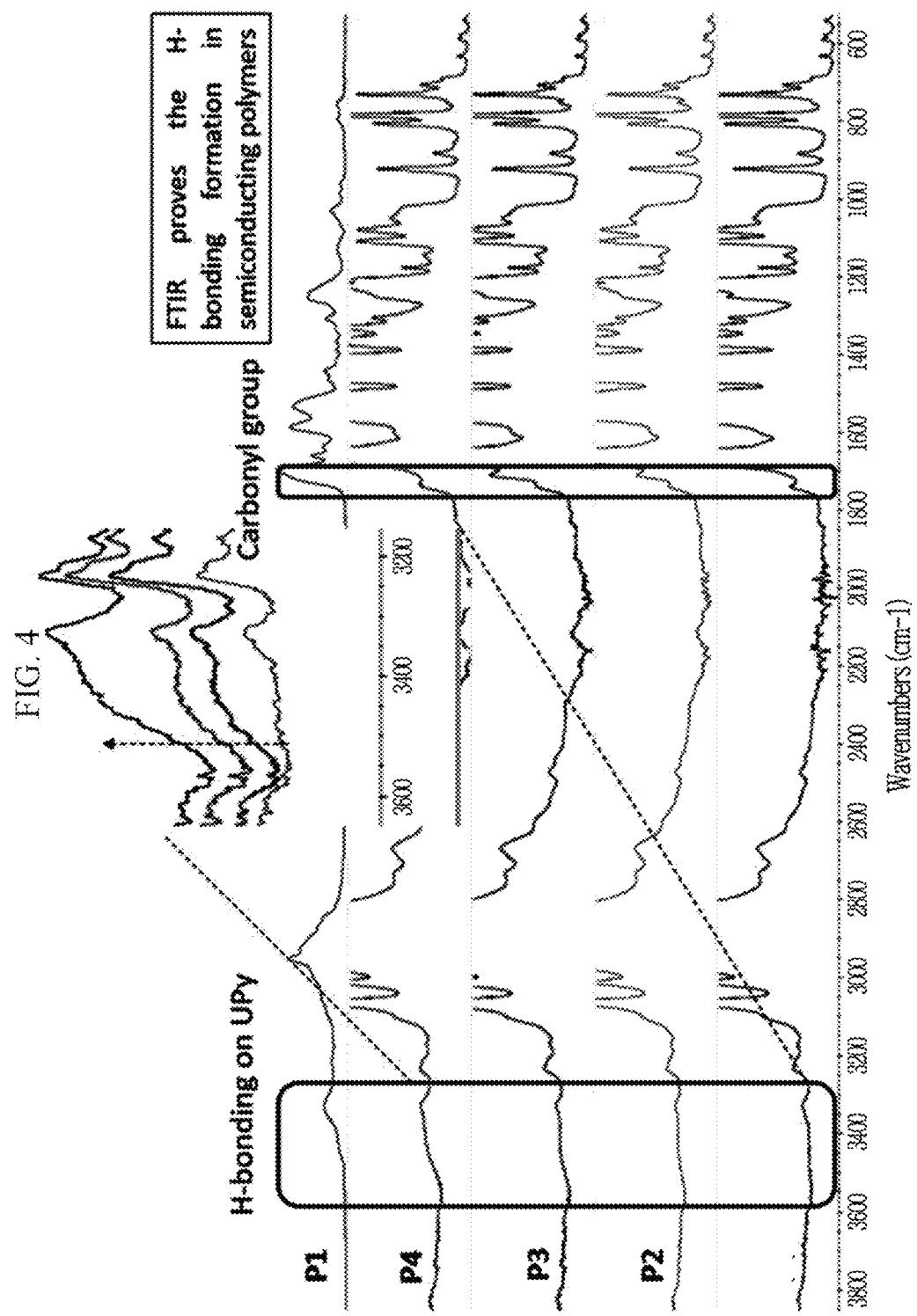
FIG. 4 is a FTIR graph of the semiconductor polymer obtained from Synthesis Example 1.
Figure 5:
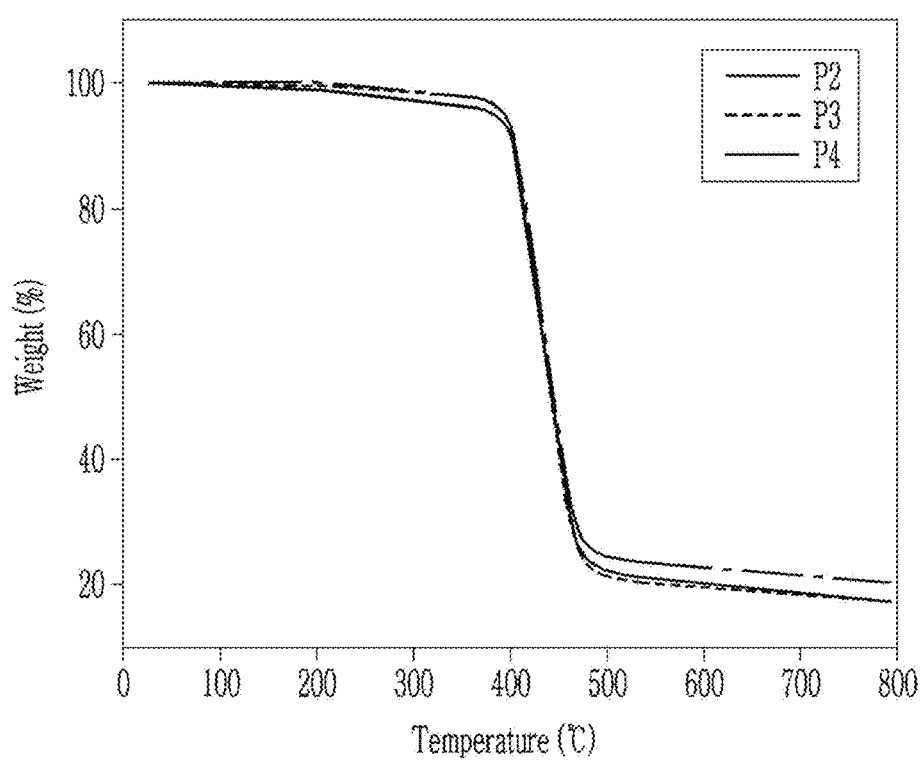
FIG. 5 is a TGA graph of the semiconductor polymer obtained from Synthesis Example 1.
Figure 6:
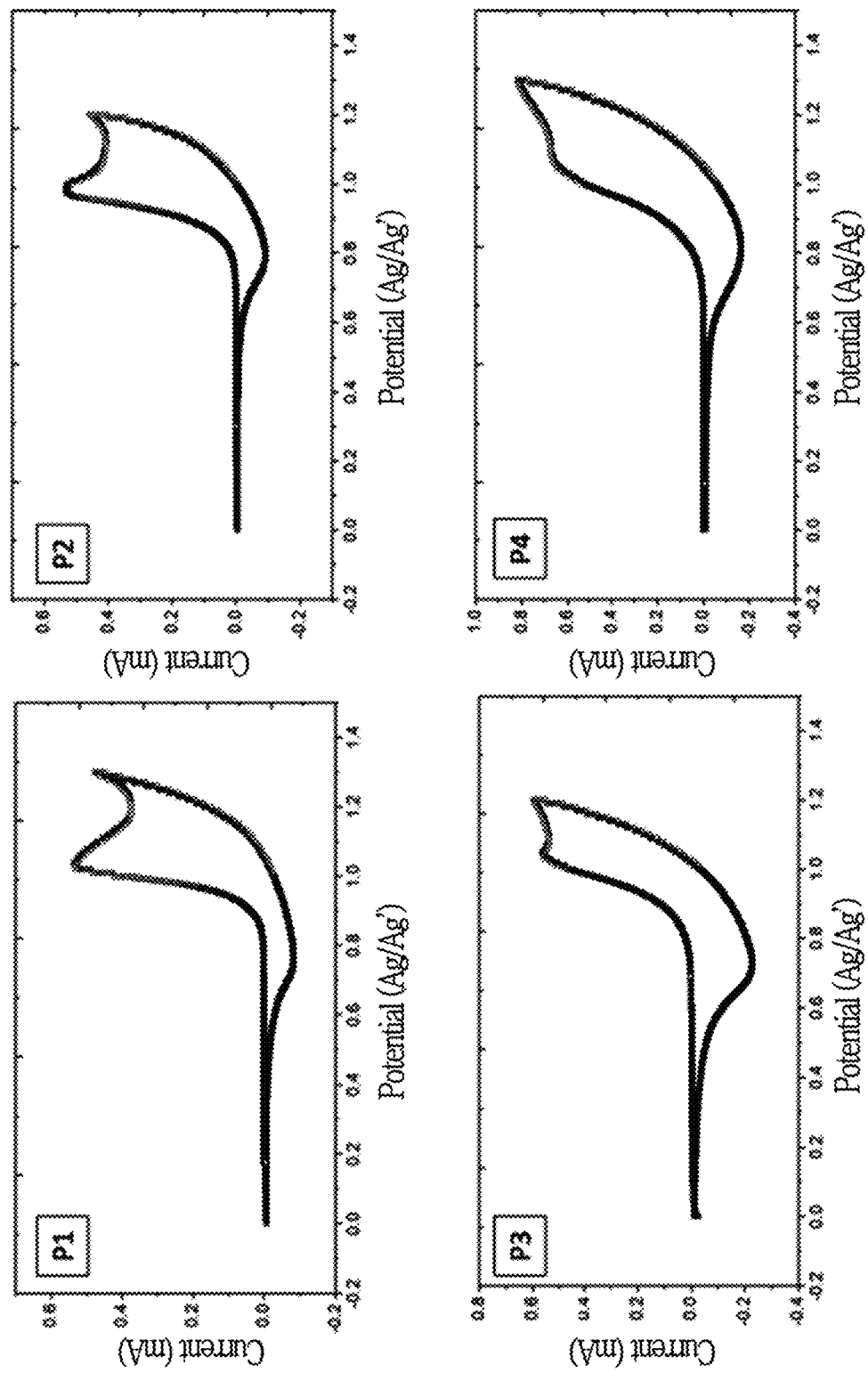
FIG. 6 is a cyclic voltammetry graph of the semiconductor polymer obtained from Synthesis Example 1.

FIG. 3 is a GPC graph of the semiconductor polymer obtained from Synthesis Example 1, FIG. 4 is a FTIR graph of the semiconductor polymer obtained from Synthesis Example 1, FIG. 5 is a TGA graph of the semiconductor polymer obtained from Synthesis Example 1, and FIG. 6 is a cyclic voltammetry graph of the semiconductor polymer obtained from Synthesis Example 1.

Synthesis Example 2: Synthesis of Elastic Polymer (1) Materials and Methods

All reactants are commercially available and used as supplied without further purification. Deuterated solvents are purchased from Acros Organics. Polytetramethylene glycol (PTMG, M.W.=1,000), isophorone diisocyanate (IPDI), and tetraethylene glycol (TEG) are purchased from Sigma-Aldrich Co., Ltd. (USA) and dried under vacuum at 80° C. Dibutyltin dilaurate (DBTDL) catalyst is purchased from Alfa Aesar. Prepolymer $1^{st}$ and 5-(2-hydroxyethyl)-6-methyl-2-aminouracil $2^{S2}$ are prepared according to methods described in S1 and S2. $^1$H NMR spectra are recorded on a Varian Mercury 400 NMR spectrometer at room temperature with use of the deuterated solvent as the lock and residual solvent or TMS (tetramethysilane) as internal reference. Gel permeation chromatography (GPC) is carried out in DMF on two PolyPore columns (Agilent Technologies Inc.) connected in series with a DAWN multiangle laser light scattering (MALLS) detector (Wyatt Technology Corp.) and an Optilab TrEX differential refractometer (Wyatt Technology Corp.). DSC experiments are carried out with TA Instruments DSC Q2000 using Tzero Aluminum pans.

S1: Zhang, Q.; He, H.; Xi, K.; Huang, X.; Yu, X.; Jia, X. Macromolecules 2011, 44, 550-557.

S2: Gangjee, A.; Yu, J.; McGuire, J. J.; Cody, V.; Calitsky, N.; Kisliuk, R. L.; Queener, S. F. J. Med. Chem. 2000, 43, 3837-3851.

[Reaction Scheme 2]

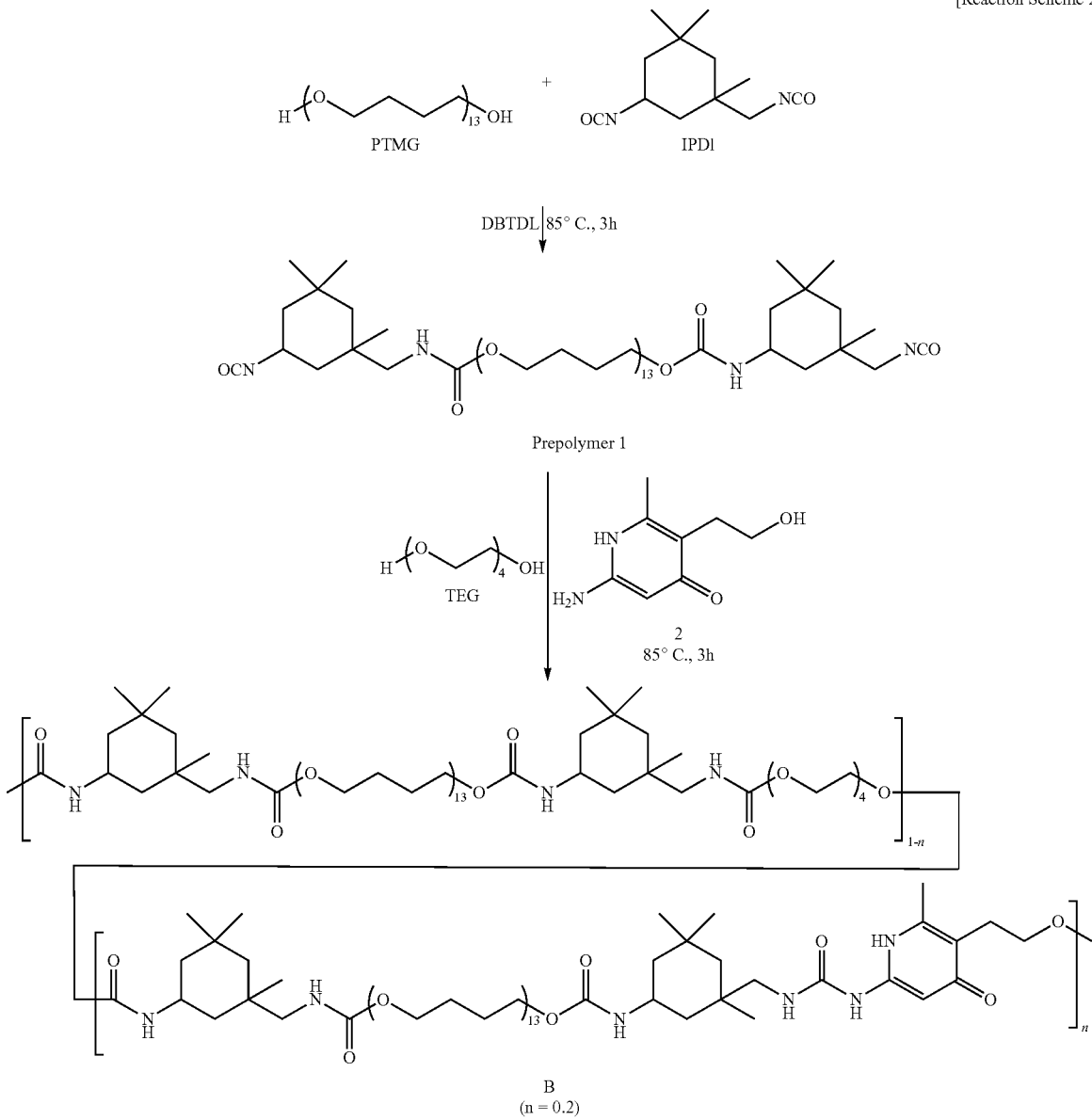

(2) Synthesis of Prepolymer 1

Polytetramethylene glycol (PTMG) (20.0 g, 20.0 mmol) and isophorone diisocyanate (IPDI) (8.89 g, 40 mmol) are added in a 250 ml three-necked flask equipped with a mechanical stirrer under a nitrogen atmosphere. Six drops of a dibutyltin dilaurate (DBTDL) catalyst are then added thereto, and the resultant mixture is kept stirring at 85° C. for 3 hours to yield Prepolymer 1. Afterwards, 20 ml of dry DMF is added thereto to dissolve Prepolymer 1 and prepare a Prepolymer 1 solution.

(3) Synthesis of Elastic Polymer

Chain extenders, tetraethylene glycol (TEG) (3.11 g, 16.0 mmol) and Compound 2 (0.677 g, 4.00 mmol) in 10 ml of dry DMSO are added to the prepolymer solution. With fully stirring at 85° C. for another 3 hours, methanol (2 ml) is added thereto, and the mixture is further stirred for 30 minutes to ensure all isocyanate groups are consumed. Then, the mixture is poured into a PTFE plate which is subsequently put in a vacuum oven at 90° C. for 12 hours to allow the reaction to complete. By dissolving the crude polymer in 70 ml of THF and then precipitating it into acetonitrile to obtain a pale-yellow elastomer (Compound B) (21.3 g, 65%). The purification process is repeated three times. A number average molecular weight ($M_n$) and a weight average molecular weight (Mw) of the obtained elastomer are respectively 38 kDa and 56 KDa, and Mw/Mn=1.48, a GPC (an eluent: DMF, a standard: PMMA) curve is shown in FIG. 7, and a NMR spectrum is shown in FIG. 8.

Figure 7:
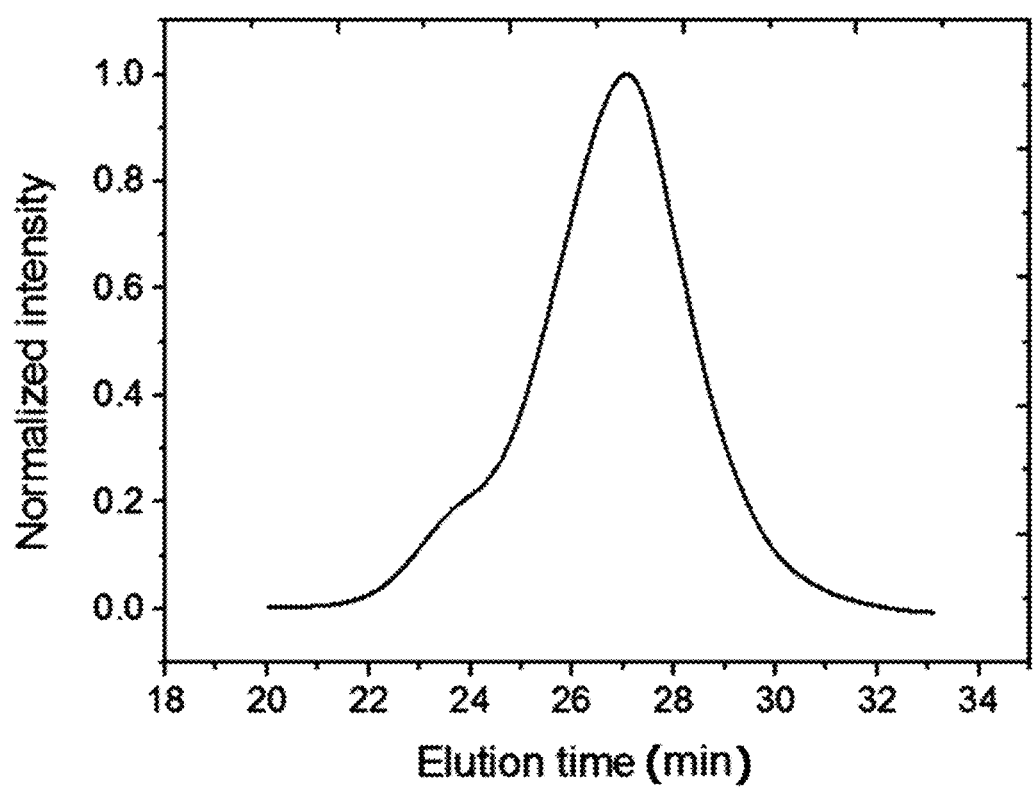
FIG. 7 is a GPC graph of the semiconductor polymer obtained from Synthesis Example 2.
Figure 8:
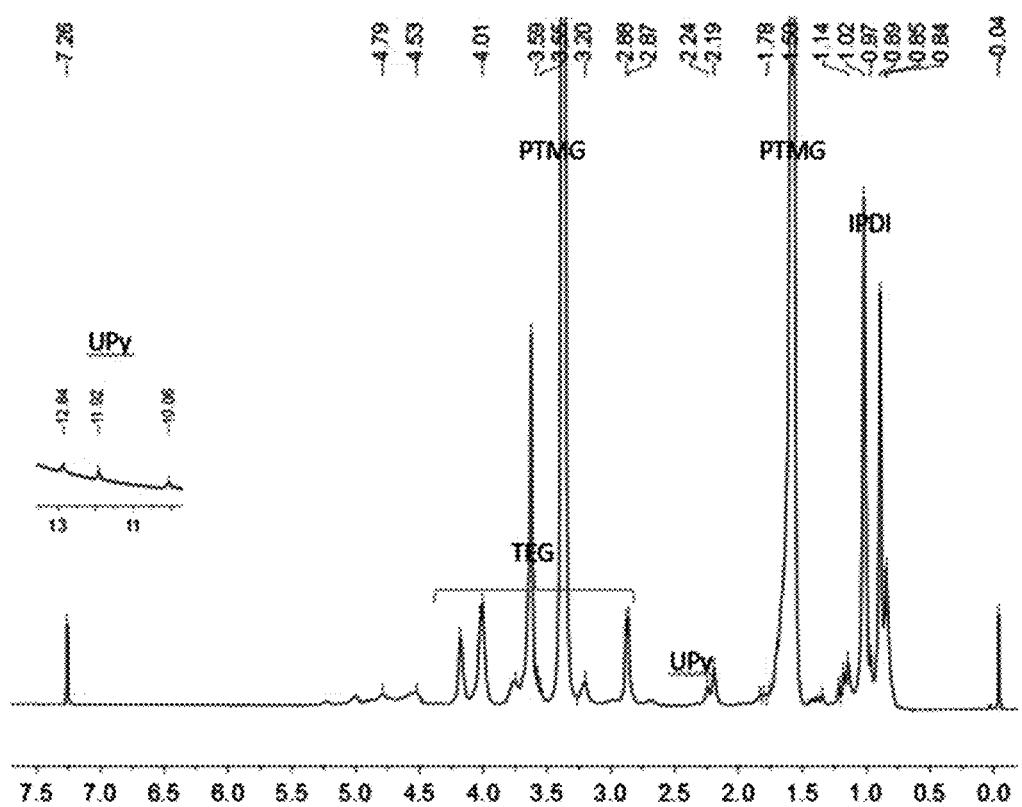
FIG. 8 shows an NMR spectrum of the elastic polymer obtained in Synthesis Example 2.

FIG. 7 is a GPC graph of the semiconductor polymer obtained from Synthesis Example 2 and FIG. 8 shows an NMR spectrum of the elastic polymer obtained in Synthesis Example 2.

$^1$H NMR (CDCl$_3$, room temperature, 400 MHz) δ (ppm): 12.84 (s), 11.92 (s), 10.06 (s), 4.44-5.26 (m), 4.18 (t), 4.01

(t), 3.52-3.84 (m), 3.28-3.47 (m), 2.88 (d), 2.24 (s), 2.19 (s), 1.99 (s), 1.48-1.87 (m), 0.76-1.24 (m).

Manufacture of Thin Film Transistor

Preparation Example 1

The semiconductor polymer (P4) according to Synthesis Example 1 and the elastomer according to Synthesis Example 2 are dissolved in chlorobenzene (18 mg/ml) to prepare a mixture. Herein, the semiconductor polymer and the elastomer are mixed in a weight ratio of 1:0.5. Subsequently, the mixture is stirred on a 90° C. hot plate for 1 hour and filtered with a syringe filter (a pore size: 1 μm) to remove microsized particles and prepare a composition. The composition is coated on a PDMS substrate and heat-treated at 100° C. and 170° C. respectively for 10 minutes to form an organic semiconductor thin film.

On the other hand, the elastomer represented by Chemical Formula B is coated on a silicon substrate including a gate region doped at a high concentration is annealed at 150° C. for 1 hour to form a 500 nm-thick gate insulator. Subsequently, on the gate insulator, the organic semiconductor thin film is transferred, and Au is thermally deposited thereon to form a source electrode and a drain electrode thereon and thus manufacture a thin film transistor.

Preparation Example 2

A thin film transistor is manufactured according to the same method as Preparation Example 1 except that the semiconductor polymer and the elastomer are mixed in a weight ratio of 1:1.

Preparation Example 3

A thin film transistor is manufactured according to the same method as Preparation Example 1 except that the semiconductor polymer and the elastomer are mixed in a weight ratio of 1:1.5.

Preparation Example 4

A thin film transistor is manufactured according to the same method as Preparation Example 1 except that the semiconductor polymer and the elastomer are mixed in a weight ratio of 1:2.

Evaluation I

Morphology of an organic semiconductor thin film in the thin film transistor according to Preparation Example 3 is evaluated. The morphology of the organic thin film is evaluated by a transmission electron microscope (TEM).

Figure 9:
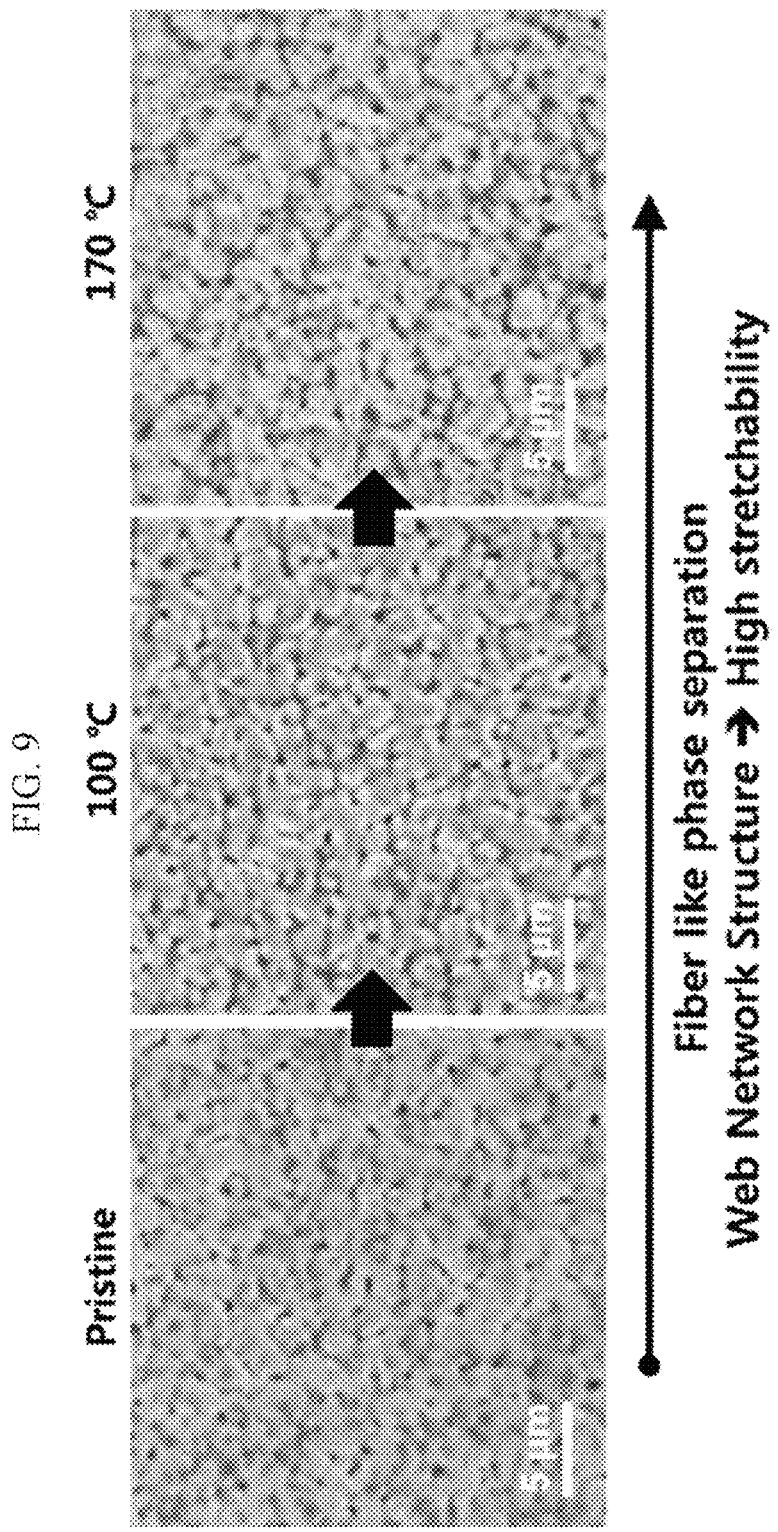
FIG. 9 is a TEM image showing morphologies of the organic semiconductor thin film in the thin film transistor according to Preparation Example 3.

FIG. 9 is a TEM image showing morphologies of the organic semiconductor thin film in the thin film transistor according to Preparation Example 3.

Referring to FIG. 9, the organic semiconductor thin film is phase-separated according to a subsequent heat treatment and specifically, formed of morphology having a web network structure that a plurality of fiber-type phase-separation domains is dispersed in an elastomer matrix.

Evaluation II

Electric characteristics of the thin film transistors according to Preparation Examples 1 to 4 are evaluated.

The results are shown in Table 2.

TABLE 2

| | Mobility (cm$^2$/Vs) |
|---|---|
| Preparation Example 1 | 0.5 |
| Preparation Example 2 | 0.3 |
| Preparation Example 3 | 0.3 |
| Preparation Example 4 | 0.1 |

Referring to Table 2, the thin film transistors according to Preparation Examples 1 to 4 exhibit satisfactory electrical characteristics.

Evaluation III

Stretchability of the thin film transistor according to Preparation Example 3 is evaluated.

The stretchability of the thin film transistor is confirmed from a morphology change of the organic semiconductor thin film, when the thin film transistor is respectively 0%, 50%, and 100% stretched in a channel direction and released.

Figure 10:
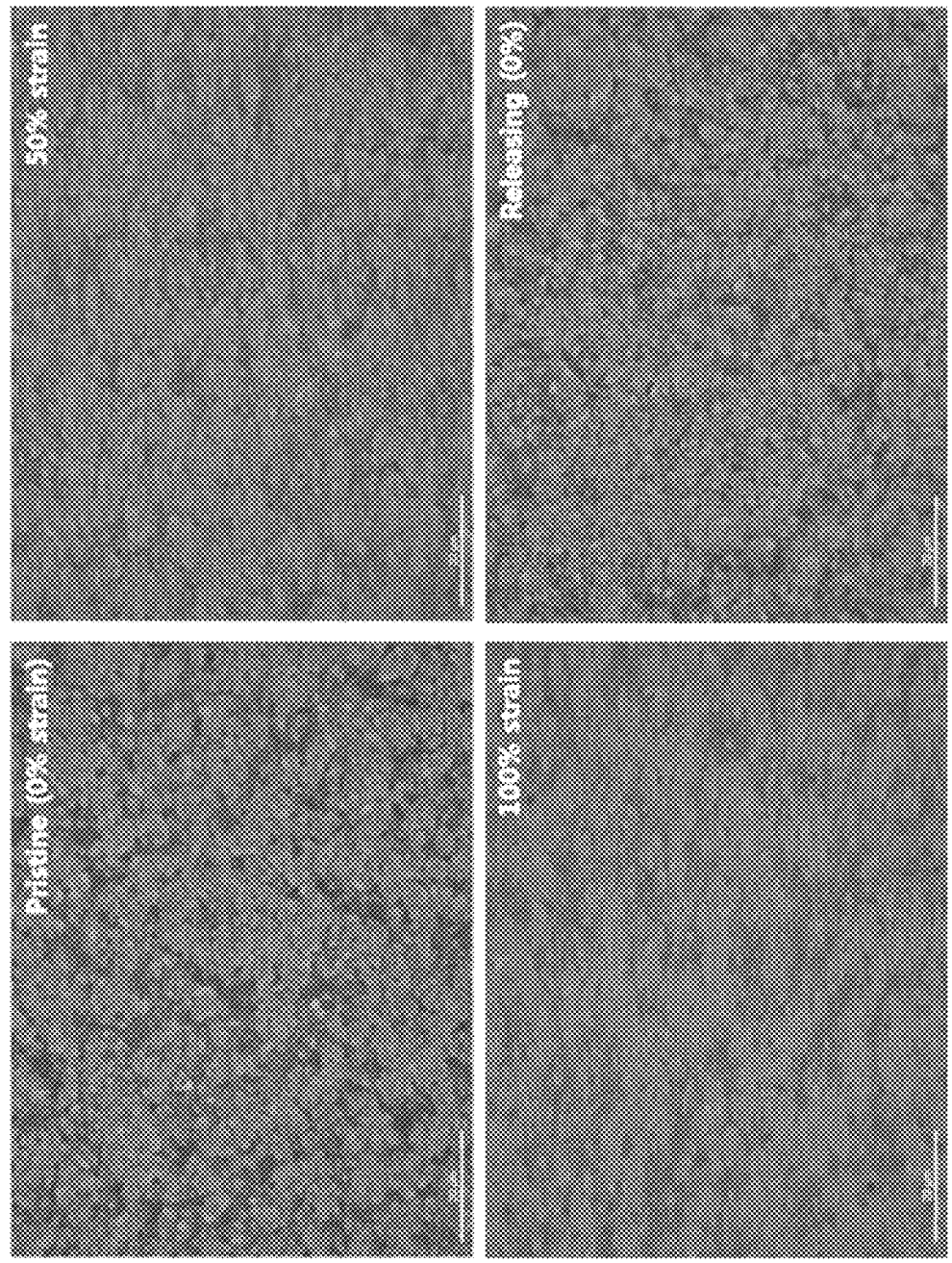
FIG. 10 is a photograph showing morphologies of a semiconductor thin film before stretching, after 50% stretching, after 100% stretching, and after releasing of the thin film transistor according to Preparation Example 3.

FIG. 10 is a photograph showing morphologies of a semiconductor thin film before stretching, after 50% stretching, after 100% stretching, and after releasing of the thin film transistor according to Preparation Example 3.

Referring to FIG. 10, the thin film transistor according to Preparation Example 3 shows a small morphology change of the organic semiconductor thin film before and after the stretching.

Evaluation IV

Self-healable characteristics of the thin film transistor according to Preparation Example 3 are evaluated.

The self-healable characteristics are evaluated from a recovery rate by cutting a channel region (the organic semiconductor thin film) of the thin film transistor according to Preparation Example 3 with a razor blade and then, allowing it to stand at room temperature for one day.

Figure 11:
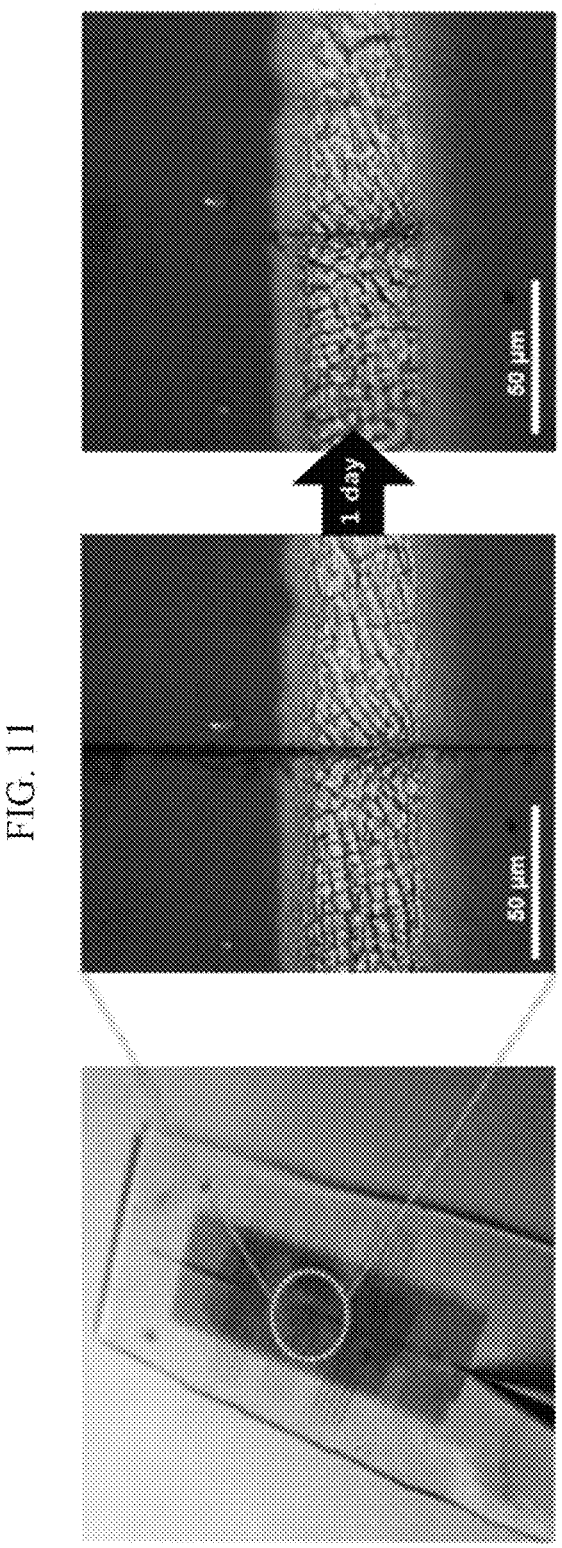
FIG. 11 is photographs showing self-healable characteristics of the thin film transistor according to Preparation Example 3.

FIG. 11 is photographs showing self-healable characteristics of the thin film transistor according to Preparation Example 3.

Referring to FIG. 11, the damaged portion of the thin film transistor according to Preparation Example 3 is self-healed after one day at room temperature.

Evaluation V

The thin film transistor according to Preparation Example 3 is stretched in horizontal and vertical directions with the channel direction, and then, an electrical characteristic change thereof is examined.

Figure 12:
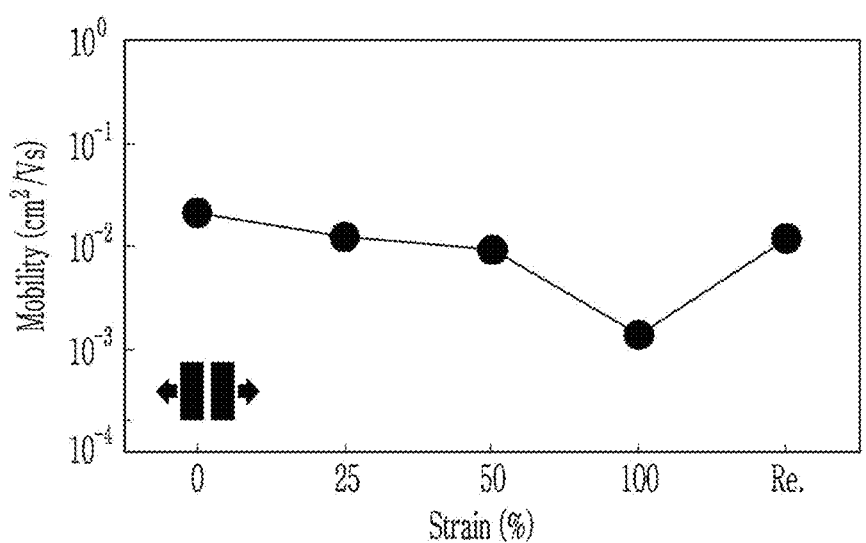
FIG. 12 is a graph showing a change of charge mobility depending on a stretching ratio when the thin film transistor according to Preparation Example 3 is stretched in a horizontal direction with respect to the channel direction.
Figure 13:
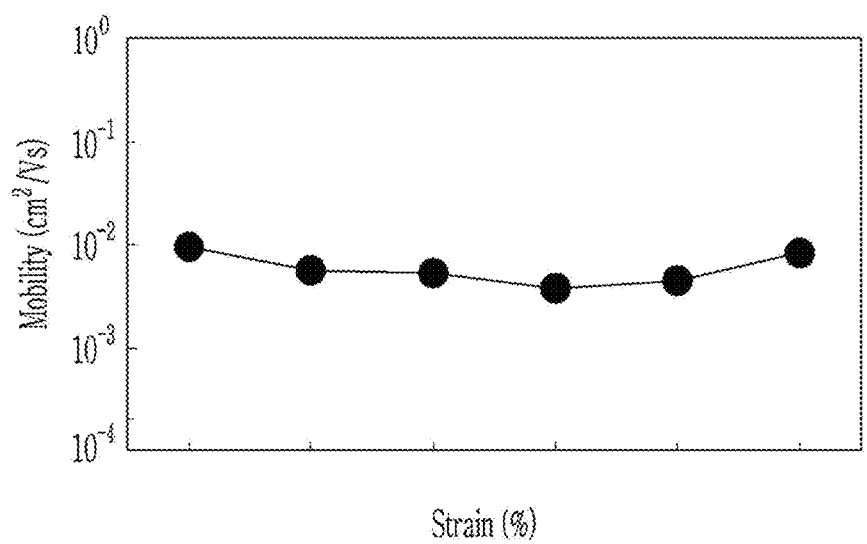
FIG. 13 is a graph showing a change of charge mobility depending on a stretching ratio when the thin film transistor according to Preparation Example 3 is stretched in a vertical direction with respect to the channel direction.

FIG. 12 is a graph showing a change of charge mobility depending on a stretching ratio when the thin film transistor according to Preparation Example 3 is stretched in a horizontal direction with respect to the channel direction and FIG. 13 is a graph showing a change of charge mobility depending on a stretching ratio when the thin film transistor according to Preparation Example 3 is stretched in a vertical direction with respect to the channel direction.

Referring to FIGS. 12 and 13, the thin film transistor according to Preparation Example 3 shows no large electrical characteristic change before and after the stretching.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A thin film transistor comprising
a gate electrode,
an active layer comprising a semiconductor material and a first elastomer,
a gate insulator between the gate electrode and the active layer, and
a source electrode and a drain electrode electrically connected to the active layer,
wherein each of the semiconductor material and the first elastomer has a hydrogen bondable moiety, and
the semiconductor material and the first elastomer are subjected to a dynamic intermolecular bonding by a hydrogen bond.

2. The thin film transistor of claim 1, wherein the hydrogen bondable moiety is a multiple hydrogen bondable moiety.

3. The thin film transistor of claim 1, wherein the hydrogen bondable moiety is a moiety represented by Chemical Formula A:

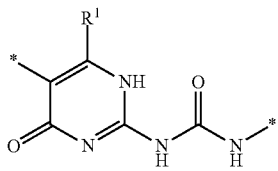

[Chemical Formula A]

wherein, in Chemical Formula A,
R$^1$ is hydrogen, a substituted or unsubstituted C1 to C30 alkyl group, or a substituted or unsubstituted C6 to C30 aryl group.

4. The thin film transistor of claim 1, wherein the hydrogen bondable moiety is represented by Chemical Formula AA:

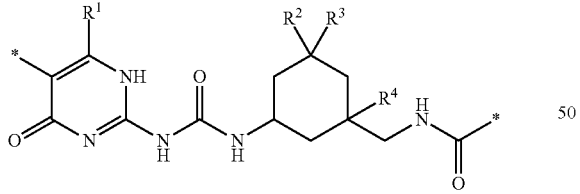

[Chemical Formula AA]

wherein, in Chemical Formula AA,
R$^1$ to R$^4$ are independently hydrogen, a substituted or unsubstituted C1 to C30 alkyl group, or a substituted or unsubstituted C6 to C30 aryl group.

5. The thin film transistor of claim 1, wherein the semiconductor material is a semiconductor polymer comprising a semiconducting moiety and the hydrogen bondable moiety, and
the first elastomer is an elastic polymer comprising an elastic moiety and the hydrogen bondable moiety.

6. The thin film transistor of claim 5, wherein the semiconducting moiety comprises a heterocycle comprising N, O, S, Se, Te, or a combination thereof.

7. The thin film transistor of claim 5, wherein the semiconductor polymer comprises at least one structural unit comprising the semiconducting moiety and the hydrogen bondable moiety, and
the semiconducting moiety comprises at least one of moieties represented by one of Chemical Formulae 1-1 to 1-10:

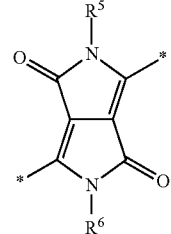

[Chemical Formula 1-1]

wherein, in Chemical Formula 1-1,
R$^5$ and R$^6$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

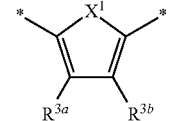

[Chemical Formula 1-2]

wherein, in Chemical Formula 1-2,
X$^1$ is O, S, Se, or NR$^a$, and
R$^a$, R$^{3a}$, and R$^{3b}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

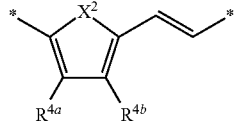

[Chemical Formula 1-3]

wherein, in Chemical Formula 1-3,
X$^2$ is O, S, Se, or NR$^a$, and
R$^a$, R$^{4a}$, and R$^{4b}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-4]

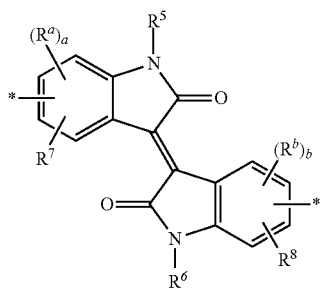

wherein, in Chemical Formula 1-4,
$R^5$, $R^6$, $R^7$, and $R^8$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,
$R^a$ and $R^b$ are a C1 to C6 alkyl group, and
a and b are independently an integer ranging from 0 to 2,

[Chemical Formula 1-5]

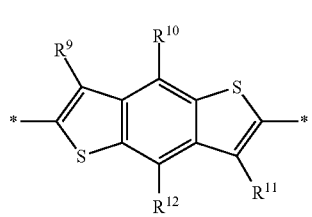

wherein, in Chemical Formula 1-5,
$R^9$, $R^{10}$, $R^{11}$, and $R^{12}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-6]

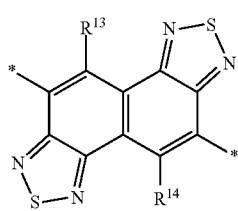

wherein, in Chemical Formula 1-6,
$R^{13}$ and $R^{14}$ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof,

[Chemical Formula 1-7]

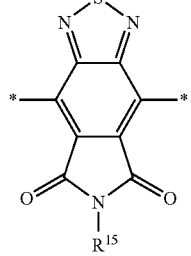

wherein, in Chemical Formula 1-7,
$R^{15}$ is a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof,

[Chemical Formula 1-8]

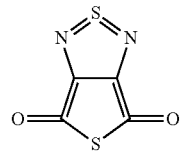

[Chemical Formula 1-9]

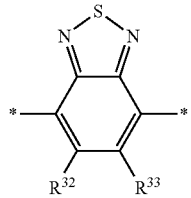

wherein, in Chemical Formula 1-9,
$R^{32}$ and $R^{33}$ are independently hydrogen, a halogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,

[Chemical Formula 1-10]

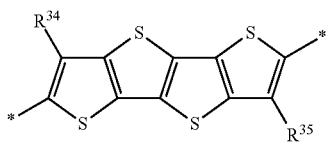

wherein, in Chemical Formula 1-10,
$R^{34}$ and $R^{35}$ are independently hydrogen, a halogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C30 aryl group, or a combination thereof, and
is a linking point with an adjacent moiety.

8. The thin film transistor of claim 7, wherein the semiconductor polymer comprises a structural unit represented by Chemical Formula 3:

[Chemical Formula 3]

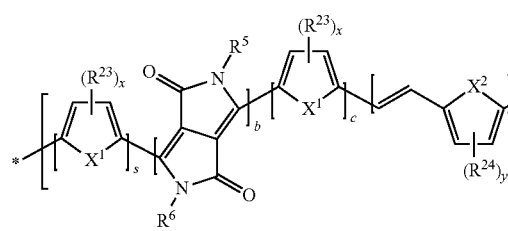

wherein, in Chemical Formula 3,
R¹ to R⁴ are independently hydrogen, a substituted or unsubstituted C1 to C30 alkyl group, or a substituted or unsubstituted C6 to C30 aryl group,
R⁵ and R⁶ are independently hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof,
R²³ and R²⁴ are independently hydrogen, a halogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof,
x and y are an integer ranging from 0 to 2,
a, c, and d are independently 0 to 10,
b is 1 to 10,
n1 and n2 are independently 0 to 30, and
is a linking point with an adjacent moiety.

9. The thin film transistor of claim 5, wherein the elastic moiety comprises a polyorganosiloxane moiety, a polyamide moiety, a polyisobutene moiety, a polyolefin moiety, a polyester moiety, a polyurethane moiety, or a combination thereof.

10. The thin film transistor of claim 5, wherein the first elastomer comprises a structural unit comprising a polyorganosiloxane moiety and a moiety represented by Chemical Formula AA:

[Chemical Formula AA]

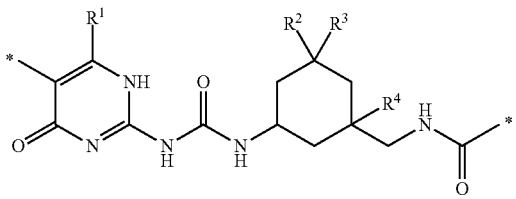

wherein, in Chemical Formula AA,
R¹ to R⁴ are independently hydrogen, a substituted or unsubstituted C1 to C30 alkyl group, or a substituted or unsubstituted C6 to C30 aryl group.

11. The thin film transistor of claim 1, wherein the active layer comprises
a matrix comprising the first elastomer, and
a plurality of fiber-like domains comprising the semiconductor material, the plurality of fiber-like domains being distributed in the matrix.

12. The thin film transistor of claim 1, wherein the active layer comprises the semiconductor material and the first elastomer in a weight ratio of about 9:1 to about 1:9.

13. The thin film transistor of claim 1, wherein the gate insulator comprises a second elastomer having a multiple hydrogen bondable moiety.

14. The thin film transistor of claim 13, wherein the second elastomer is an elastic polymer comprising an elastic moiety and the multiple hydrogen bondable moiety.

15. The thin film transistor of claim 14, wherein the elastic moiety comprises a polyorganosiloxane moiety, a polyamide moiety, a polyisobutene moiety, a polyolefin moiety, a polyester moiety, a polyurethane moiety, or a combination thereof.

16. The thin film transistor of claim 13, wherein the multiple hydrogen bondable moiety is a moiety represented by Chemical Formula A:

[Chemical Formula A]

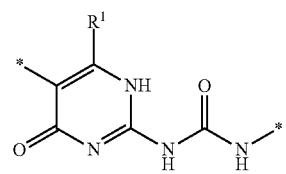

wherein, in Chemical Formula A,
R¹ is hydrogen, a substituted or unsubstituted C1 to C30 alkyl group, or a substituted or unsubstituted C6 to C30 aryl group.

17. The thin film transistor of claim 13, wherein the multiple hydrogen bondable moiety is represented by Chemical Formula AA:

[Chemical Formula AA]

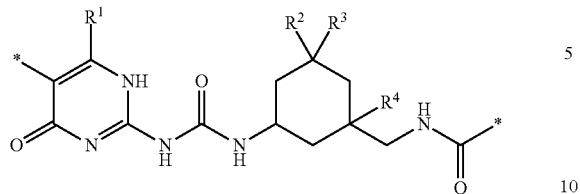

wherein, in Chemical Formula A,
$R^1$ to $R^4$ are independently hydrogen, a substituted or unsubstituted C1 to C30 alkyl group, or a substituted or unsubstituted C6 to C30 aryl group.

18. The thin film transistor of claim 1, wherein the gate insulator has a thickness of about 1 μm to about 3 μm.

19. The thin film transistor of claim 1, wherein at least one of the gate electrode, the source electrode, and the drain electrode comprises a flexible conductor.

20. A thin film transistor array comprising a plurality of thin film transistors of claim 1, the plurality of thin film transistors being arranged in a matrix format.

21. An electronic device comprising an array of the thin film transistors of claim 1.

22. The electronic device of claim 21, wherein the electronic device is a wearable device or a skin-type device.

* * * * *

UNITED STATES PATENT AND TRADEMARK OFFICE
CERTIFICATE OF CORRECTION

| | |
|---|---|
| PATENT NO. | : 11,075,348 B2 |
| APPLICATION NO. | : 16/534253 |
| DATED | : July 27, 2021 |
| INVENTOR(S) | : Youngjun Yun et al. |

It is certified that error appears in the above-identified patent and that said Letters Patent is hereby corrected as shown below:

On the Title Page

Item (73) Assignees:
Reads:
Samsung Electronics Co., Ltd., Gyeonggi-Do (KR)
Should read:
\*\* Samsung Electronics Co., Ltd., Gyeonggi-Do (KR); and
The Board of Trustees of The Leland Stanford Junior University, Stanford, CA (USA) \*\*

Signed and Sealed this
Fourth Day of July, 2023

Katherine Kelly Vidal
*Director of the United States Patent and Trademark Office*